Figure 1:
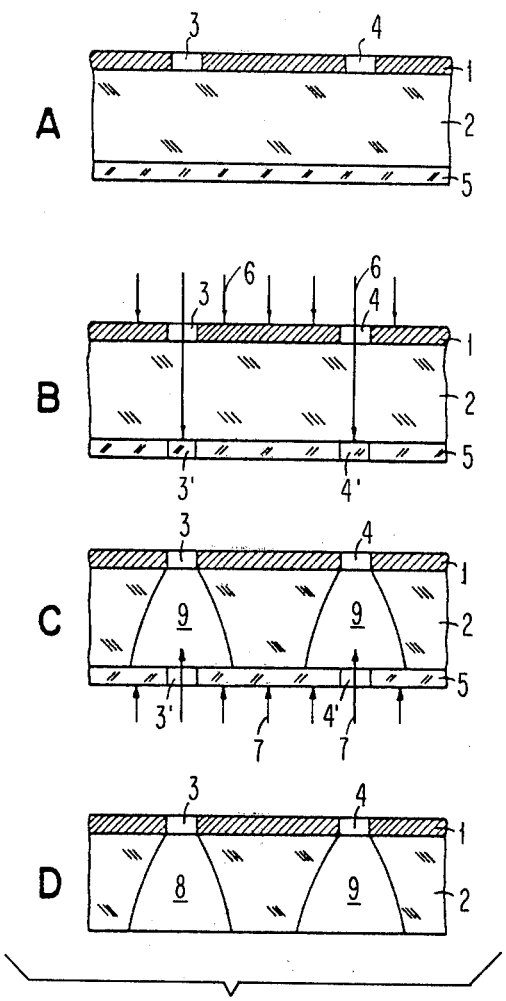

United States Patent [19]

Ruh et al.

[11] 4,059,480
[45] Nov. 22, 1977

[54] METHOD OF FORMING VIADUCTS IN SEMICONDUCTOR MATERIAL

[75] Inventors: Wolf-Dieter Ruh; Gerhard Trippel, both of Sindelfingen, Germany

[73] Assignee: International Business Machines Corporation, Armonk, N.Y.

[21] Appl. No.: 727,831

[22] Filed: Sept. 29, 1976

[30] Foreign Application Priority Data

Feb. 9, 1976 Germany .............................. 2604939

[51] Int. Cl.$^2$ ....................... B23P 15/00; B23P 25/06; B44C 1/22
[52] U.S. Cl. ......................................... 156/644; 96/36; 156/657; 156/661; 156/663; 427/82
[58] Field of Search .................... 427/88, 92, 82, 125, 427/230; 156/3, 8, 11, 15, 17, 18, 644, 655, 657, 659, 661, 662, 663; 96/32, 33, 36, 36.2, 38.4, 36.1; 29/580; 204/192

[56] References Cited

U.S. PATENT DOCUMENTS

| | | | |
|---|---|---|---|
| 3,202,094 | 8/1965 | Smallman | 96/36.2 X |
| 3,313,626 | 4/1967 | Whitney | 96/33 |
| 3,576,669 | 4/1971 | Filip | 427/125 |
| 3,742,229 | 6/1973 | Smith et al. | 156/3 X |
| 3,958,255 | 5/1976 | Chiou et al. | 156/11 X |

OTHER PUBLICATIONS

IBM Technical Disclosure Bulletin, vol. 15, No. 11, Apr. 1973, Electron–Beam Mask Useful in Microfabrication Processes by E. A. Giess, L. Kuhn and B. A. Scott, pp. 3309 and 3310.

*Primary Examiner*—William A. Powell
*Attorney, Agent, or Firm*—George E. Roush

[57] ABSTRACT

This method of forming viaducts or "through-holes" in semiconductor material for transistor and integrated circuit fabrication and especially for ink jet printing systems forms viaducts of uniform diameter without critical registration of masks.

A seed layer of Cr-Au is sputtered onto a silicon-dioxide substrate. The viaducts or holes to be made are imaged by a photoresist process with a 5 μ thick photoresist on this seed layer. A 4 μ thick gold layer is now applied on the seed layer by a plating process. After the dissolution of the photoresist this layer contains the hole pattern with the holes having the required diameter. In order to make a through-hole, the substrate has to be etched. For that purpose, the bare substrate surface is covered with photoresist and exposed from the back through gold holes, and subsequently developed. Problems owing to light diffraction at the edges of the gold with respect to the great distance of the gold mask - photoresist layer are not anticipated here because of the large holes and the high tolerances in this process step. Prior to etching the substrate, the gold layer with the hole pattern is covered by photoresist so that the substrate etching can take place from one side only. Now the substrate is etched until all of the gold holes are free. In that process, the extent of the substrate sub-etching is of small importance as the viaduct or hole diameter is defined by the gold mask. The photoresist is removed and the exposed substrate surfaces are protected against chemical reactions with the ink by a vapor-deposition of a protective layer.

12 Claims, 2 Drawing Figures

METHOD OF FORMING VIADUCTS IN SEMICONDUCTOR MATERIAL

The invention relates to a method of making small viaducts or "through-holes" in plates consisting of two layers where the holes in the two layers are made successively. Such viaducts or through-holes are to be used particularly as nozzles for ink jet printers, but the invention is not limited to the forming of nozzles but equally applicable to the fabrication of transistors and integrated circuitry.

In ink jet printing, a series of ink droplets is thrown against paper or other record medium. The ink is ejected through a nozzle or several closely adjacent nozzles in a container of ink by vibrating the ink, for example, by means of piezo crystal. Thus ink droplets are formed at a distance outside the nozzle which are selectively charged at the moment of their generation by a charging electrode. When one single nozzle is used, the drops are deflected more or less strongly by a constant deflection field in that the charge which is applied to the drops by a means of the charging electrode varies in its amplitude. In ink jet printing with a multiple of nozzles, all nozzles eject droplets simultaneously, and a charging electrode is arranged in front of each nozzle in the droplet formation area. A constant deflection field deflects the droplets that have received a charge from the charging electrode, in such a manner that they do not reach the paper. Only the uncharged droplet fly in a straight line towards the paper and form the characters. Ink jet printers of the first type with one nozzle are described, for example, in U.S. Pat. No. 3,596,275. Ink jet printers with several parallel nozzles are described in U.S. Pat. No. 3,373,437.

High quality ink jet printing demands that the individual droplets and thus the spots made when the drops impinge on the paper, are sufficiently small and closely adjacent so that they are no longer recognizable as individual droplets. In order to obtain this result, 80 drops or more are required for each centimeter of length, and each drop is to have a diameter of less than 0.175 mm. In order to achieve this, the nozzle openings should have a diameter of not more than 0.05 mm, and with multiple nozzles the distance from hole center to hole center should be in the order of 0.25 mm or smaller if possible.

In a prior German patent application No. P 25 54 085.6 and in U.S. Pat. No. 3,958,255 it has been suggested to apply a known method of photolithography originating in semiconductor technology for making nozzles for ink jet printers. In accordance with this prior patent application, viaducts or through-holes are made in plates which consist of two layers, for instance of a thick silicon layer and a thin silicon dioxide layer. By means of the above-mentioned etching technique, cone-shaped holes are first etched into the thick silicon layer, and subsequently smaller holes are etched into the thin silicon dioxide layer. The advantage of this process lies in the fact that the actual nozzle openings, which are formed by the small holes in the thin silicon dioxide layer, can be made with very close tolerances with respect to the diameter and the distance from any other nozzle openings. Since both holes in the two layers are etched from different sides, it is necessary that with respect to their openings, the masks are in full congruence on the photoresist layers on the surfaces of the two layer material to ensure that the holes in the two layers are in precise alignment. Owing to the small dimensions it is difficult to adjust the masks in such a manner that the holes show the same symmetry axis. A lateral shifting of the symmetry axes, however, can have the effect that the ink jet is not ejected vertically to the surface of the nozzles.

The invention also contemplates a two layer material, a hole being etched into at least one of the layers. It is the object of the invention to provide a method by means of which it is possible to make the holes in the two layers of the plate so precisely one beneath the other that the symmetry axes of the two holes coincide.

The process according to the invention is characterized in that the first layer consists of material that is impervious to radiation of a predetermined wavelength range, and that the second layer consists of a material that is pervious to that radiation, that first the hole (holes) is (are) made in the first layer, that the outer side of the second layer is coated with positive working photoresist which is subsequently exposed through the hole (holes) in the first layer, and that after development of the photoresist the hole (holes) in the second layer is (are) etched.

By means of the process according to the invention, viaducts generally and not only nozzles for ink jet printers can be made. Following this process through-holes can quite generally be made where very high precision is of great importance. Such through-holes can for instance also be used as dies for drawing synthetic fibers of maximum fineness.

Embodiments of the process as disclosed by the invention will be explained in detail below with reference to the figures of the drawing in which:

FIG. 1 sets forth the main steps of the process as disclosed by the invention.

Figure 2:
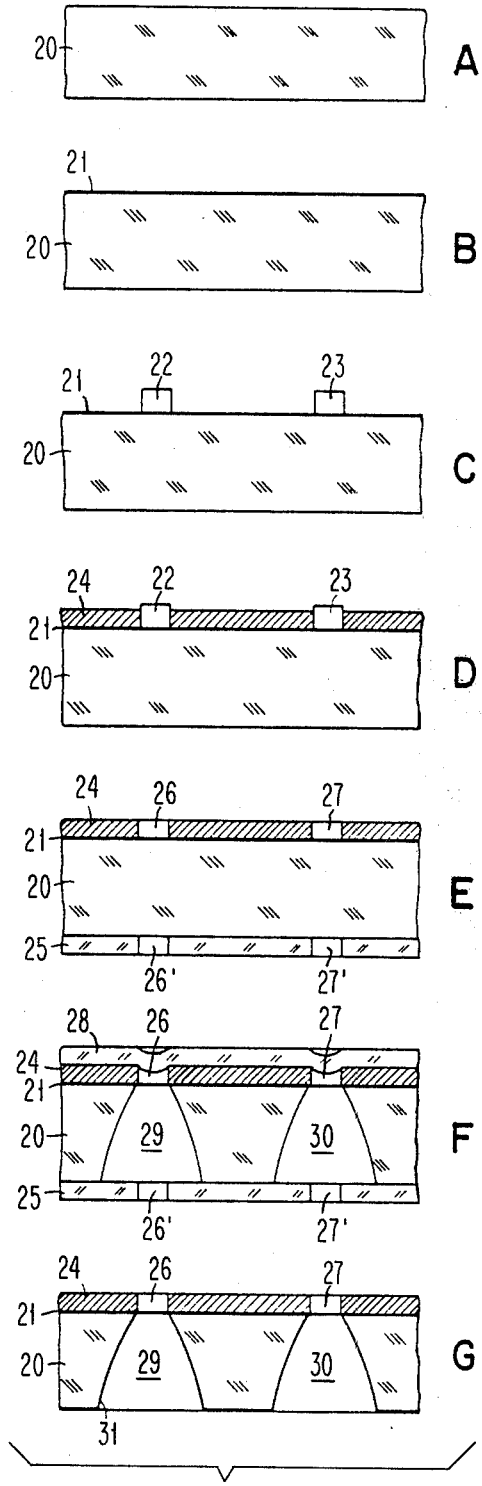

FIG. 2 shows further developments of the process represented in FIG. 1.

Starting material for the process according to the invention is the plate shown in FIG. 1A which consists of a first layer 1 and a second layer 2. In the example give, layer 1 is much thinner than layer 2. Holes 3 and 4 are made in layer 1 by the preceding process steps, which holes form the actual openings of the nozzles to be made. Suitable processes for making these holes 3 and 4, for instance, comprise etching through photoresist masks, mechanical boring or boring with electron beams. Another process for making the holes in layer 1 will be described below in connection with FIG. 2. Layer 1 preferably is made of metal; when the through-holes are used as nozzles for ink jet printers, the metal should be resistant to highly corrosive ink. Particularly suitable for that purpose are the noble metals: gold and platinum. In the present embodiment second layer 2 consists of amorphous silicon dioxide, i.e., quartz glass. In a first process step which is shown in FIG. 1A, a thin layer 5 of positive working photoresist is applied on the outer side of second layer 2.

In the next process step, FIG. 1B, the plate is exposed from the outer side of first layer 1 with light in the visible wavelength range, indicated by arrows 6. This light 6 can permeate first layer 1 which consists, for instance, of gold, only in those places where there are holes 3 and 4. As second layer 2 consists of quartz glass, light rays 6 can permeate this layer and expose positive working photoresist layer 5 at positions 3' and 4' which are exactly beneath holes 3 and 4. Subsequently, photoresist 5 is developed. i.e., removed at positions 3', 4' so that the photoresist shown holes there.

Instead of the exposure by light within the visible wavelength range it is also possible to use radiation of other frequencies. For exposing photoresist layer 5 it is for instance possible to use infrared radiation or X-rays. The important factor is to select the materials for layers 1 and 2 in such a manner that first layer 1 does not permit the permeation of the radiation at all, or at lease only with considerable attenuation, whereas layer 2 has to be considerably permeable to the radiation. If for instance infrared radiation is employed, gold or platinum of suitable thickness can be used for layer 1, whereas crystalline silicon is suitable for layer 2.

Photoresists that consist of a photosensitive resist solution, a diluting agent and a developer are commercially available. The resist solution contains a soluble polymer and a photosensitizer or photoinitiator. Stabilizers and plasticizers can be admixed. In positive working resist systems the diluting agent is an aqueous, strongly alkaline solution which contains an additional substance, e.g. a wetting agent.

In the next process step, FIG. 1C, arrows 7 indicate that an etchant is applied which can attack layer 2 only by way of openings 3', 4'. After an extended reaction period, etchant 7 finally produces conical holes 8 and 9 in silicon dioxide layer 2.

The entire plate can be immersed in the etchant for etching silicon dioxide layer 2. In that case, however, a so-called selective etchant should be used which does not attack layer 1, i.e., in that case gold or platinum. However, if the viaduct or through-holes are to have conical shape, which is frequently needed for nozzles, it is advisable to cover the outer side of gold layer 1 with photoresist so that the etchant can act on silicon dioxide layer 2 only via openings 3', 4'.

On the other hand, it is equally possible to apply the etchant, for instance, in the form of a wet mist only on the outside of the plate which is covered by photoresist mask 5. An etchant suitable for silicon dioxide is hydrofluoric acid buffered with ammonium fluoride in a ration of 1:5.

If in accordance with step 1D, the photoresist layer is removed (stripped), the nozzle plate with viaduct or through-holes or nozzles 3, 8 and 4, 9 is obtained. The photoresist layer can be removed by means of acids or organic solvents. For safety reasons it is, however, recommended to removed the photoresist by means of chemical combustion in an oxygen glow discharge. The photoresist incinerates within a few minutes. The discharge in the cold incinerator, for example, is carried out at a frequency of 13.56 MHz. Oxygen pressure is approximately 1 Torr.

By means of FIG. 2, an example for carrying out a process according to the invention will be described in a more specific form than in connection with FIG. 1. FIG. 2 shows as starting material second layer 20, for instance of silicon dioxide. The thickness of this layer can be between 0.13 and 0.25 mm. In step 2B, a thin seed layer 21 is applied on the upper side of second layer 20. This seed layer 21 consists of two layers, a thin layer of chromium and a superimposed gold layer. Seed layer 21 can be applied by means of the known cathode sputtering or by means of vapor-deposition. The thickness of the entire seed layer 21 lies in the order of 0.01 μm.

In step 2C, cylindrical islands 22 and 23 of photoresist are generated in that spot where the nozzle openings are to be located. These photoresist islands 22 and 23 are applied by means of the known photolithographic process generally known in semiconductor technology. This is performed in that a photoresist layer covering seed layer 21 is exposed and subsequently developed by means of a mask which is permeable to light and the locations of photoresist islands 22 and 23. In that case, a so-called negative working photoresist would have to be used. However, a so-called positive working photoresist can be used, too. In that case the mask would have to be of a design such that at the locations of photoresist islands 22 and 23 the permeation of light is not permitted. According to the step represented by FIG. 2D, a gold layer is applied as first layer on seed layer 31 by means of galvanic electroplating. The thickness of layer 24 is 4 μm.

Subsequently, in step 2E, photoresist islands 22 and 23 are removed chemically by acetone, for example, or by means of the cold incineration described in connection with FIG. 1D. Then, a photoresist layer 25 is applied on the lower side of second layer 20. Through holes 26 and 27 in first layer 24, which form after the removal of photoresist islands 22 and 23, photoresist layer 25 can now be exposed through layer 20 — in the present case by light in the visible frequency range. Seed layer 21 is generally to thin that the light can permeate it practically unimpeded. However, should this layer attenuate the light too strongly, it is recommended that seed layer 21 be removed at locations 26 and 27 prior to the exposure, e.g., by means of etching, particularly the so-called sputter etching. After exposure, photoresist 25 which consists of positive working photoresist is developed so that at locations 26' and 27' which are precisely beneath holes 26 and 27 there from holes in photoresist layer 25. In the following process step, in FIG. 2F, layer 20 is etched away from holes 26' and 27', e.g., by means of hydrofluoric acid buffered by ammonium fluoride in a 5:1 ratio, until funnel-like holes form in layer 20 which reach into holes 26, 27. If the seed layer has not been previously removed by sputter etching for better exposure, this seed layer can now be etched away, too, during the etching process as in accordance with FIG. 2F. So as to prevent that the etchant does not act too long on holes 26 and 27 and possibly deforms or enlarges them, it is recommended to apply a photoresist layer 28 during etching on the outer side of first layer 24.

In accordance with FIG. 2G, the two photoresist layers 28 and 25 are first removed in accordance with one of the above-described methods. As the ink in ink jet printers is highly corrosive, it is recommended that the surface of silicon dioxide layer 20 be protected by a thin surface coating 29, e.g., of gold or platinum. This layer 29, too, can for instance be applied by means of cathode sputtering (sputtering), or by vapor-deposition.

In order to give an idea of the dimensions of the typical devices formed by means of the process according to the invention, typical dimensions will be given below as they are required, for instance, for nozzles used in ink jet printers. The hole diameters in upper layer 24 are, for instance, between 10 and 20 um. As already pointed out, the thickness of layer 24 is in the order of 4 μm. The thickness of layer 20, for instance, is 0.13 mm to 0.25 mm. In multiple ejection heads, the distance between adjacent nozzles can be between 0.1 and 0.4 mm.

While the invention has been described in terms of a preferred embodiment and alternatives have been suggested, it should be clearly understood that those skilled in the art will make further changes without departing from the spirit and scope of the invention as defined in the appended claims concluding the specification.

The invention claimed is:

1. A method of forming viaducts in semiconductor devices consisting of two layers by forming the viaducts in said two layers successively, and
   said semiconductor devices are characterized by
      a first layer comprising a material that is impervious to radiation of a predetermined wavelength range, and a second layer comprising a material that is pervious to that radiation,
   further comprising the steps of
   forming a viaduct in said first layer,
   coating the outer side of said second layer with positive working photoresist,
   exposing said photoresist through said viaduct in said first layer for forming an aperture in said coating aligned with the viaduct in said first layer, and
   etching the viaduct in said second layer through said aperture formed in said exposed photoresist.

2. A method as defined in claim 1,
   further characterized by
   said radiation being in the visible range,
   said first layer comprising a metal, and
   said second layer comprising glass.

3. A method as defined in claim 2,
   further characterized by said second layer comprising amorphous silicon dioxide.

4. A method as defined in claim 1,
   further characterized by
   said radiation being in the infrared range,
   said first layer comprising a metal, and
   said second layer comprising silicon.

5. A method as defined in claim 1,
   further characterized by
   said radiation being X-ray radiation, and
   said first layer comprising a metal.

6. A method as defined in claim 2
   further characterized by
   said first layer comprising gold.

7. A method as defined in claim 1,
   further characterized by the step of
   boring said viaduct in said first layer with an electron beam.

8. A method as defined in claim 1,
   further characterized by the manner of forming a viaduct in said first layer comprising the steps of
   coating one side of said second layer with photoresist for forming said first layer, and
   etching said viaduct in said first layer.

9. A method as defined in claim 1
   further characterized by the steps of
   forming said viaduct into said first layer, laying down islands of photoresist onto said second layer in the location of the succeeding viaducts, and
   subsequently applying said first layer by means of a step of the class of plating, and sputtering.

10. A method as defined in claim 1
    further characterized by the step of
    covering said first layer with photoresist during the etching of said second layer.

11. A method as defined in claim 1
    further characterized by the step of
    applying a protective layer on the inner side of the viaduct of the second layer.

12. A method as defined in claim 11,
    further characterized by
    said protective layer consisting of gold, and applying said gold protective layer by a step of the class of plating, sputtering, and vapor deposition.

* * * * *